(12) United States Patent
Feder et al.

(10) Patent No.: US 6,985,000 B2
(45) Date of Patent: *Jan. 10, 2006

(54) THERMAL CONTROL OF A DUT USING A THERMAL CONTROL SUBSTRATE

(75) Inventors: Jan Feder, Westerville, OH (US); Rick Beyerle, Columbus, OH (US); Stephen Byers, Dublin, OH (US); Thomas Jones, Westerville, OH (US)

(73) Assignee: Delta Design, Inc., Poway, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/900,470

(22) Filed: Jul. 28, 2004

(65) Prior Publication Data

US 2005/0007136 A1 Jan. 13, 2005

Related U.S. Application Data

(62) Division of application No. 10/197,880, filed on Jul. 19, 2002, now Pat. No. 6,825,681.

(51) Int. Cl.
*G01R 31/26* (2006.01)
*F25B 21/00* (2006.01)
*F25B 21/02* (2006.01)

(52) U.S. Cl. .............................. 324/760; 62/3.1; 62/3.2

(58) Field of Classification Search ................ 324/760, 324/158.1; 62/3.1–3.3; 361/134, 704; 355/30; 250/443.1; 219/483; 257/930
See application file for complete search history.

(56) References Cited

U.S. PATENT DOCUMENTS

| | | |
|---|---|---|
| 3,700,857 A | 10/1972 | Brandes et al. |
| 3,836,751 A | 9/1974 | Anderson |
| 4,126,824 A | 11/1978 | Thornburg et al. |
| 4,357,526 A | 11/1982 | Yamamoto et al. |
| 4,374,316 A | 2/1983 | Inamori et al. |
| 4,624,137 A | 11/1986 | Johnson et al. |
| 4,684,783 A | 8/1987 | Gore |
| 4,744,246 A | 5/1988 | Busta |
| 4,777,434 A | 10/1988 | Miller et al. |
| 4,808,009 A | 2/1989 | Sittler et al. |
| 4,909,078 A | 3/1990 | Sittler et al. |
| 4,956,793 A | 9/1990 | Bonne et al. |
| 5,059,770 A | 10/1991 | Mahawii |
| 5,126,656 A | 6/1992 | Jones |
| 5,164,661 A | 11/1992 | Jones |
| 5,315,240 A | 5/1994 | Jones |
| 5,352,870 A | 10/1994 | Daugherty et al. |

(Continued)

FOREIGN PATENT DOCUMENTS

WO    WO 98/05060    2/1998

(Continued)

OTHER PUBLICATIONS

Thermal Measurement Chips (TMC-s), http://www.micred.com/prodserv/products/measdev/test_dies/ttmc.html, MicReD Ltd. Last Modified: Nov. 26, 2001.

(Continued)

*Primary Examiner*—Paresh Patel
(74) *Attorney, Agent, or Firm*—Foley & Lardner LLP

(57) ABSTRACT

A solid state thermal control device contains a substrate and a plurality of solid state thermal elements on the substrate. The thermal elements are adapted to provide thermal control to a device under test (DUT). Each solid state thermal element contains at least one solid state heater and an active control circuit adapted to control a thermal output of the heater. Optionally, the each thermal element may also include a solid state temperature sensor.

46 Claims, 10 Drawing Sheets

U.S. PATENT DOCUMENTS

| | | | |
|---|---|---|---|
| 5,420,520 | A | 5/1995 | Anschel et al. |
| 5,420,521 | A | 5/1995 | Jones |
| 5,539,186 | A | 7/1996 | Abrami et al. |
| 5,550,482 | A | 8/1996 | Sano |
| 5,605,612 | A | 2/1997 | Park et al. |
| 5,643,483 | A | 7/1997 | Kubota et al. |
| 5,669,419 | A | 9/1997 | Haas |
| 5,672,980 | A | 9/1997 | Charlton et al. |
| 5,740,016 | A | 4/1998 | Dhindsa |
| 5,751,015 | A | 5/1998 | Corbett et al. |
| 5,821,505 | A | 10/1998 | Tustaniwskyj et al. |
| 5,911,897 | A | 6/1999 | Hamilton |
| 5,940,110 | A | 8/1999 | Nakamura et al. |
| 5,977,785 | A | 11/1999 | Burward-Hoy |
| 5,982,013 | A | 11/1999 | Kishi et al. |
| 6,389,225 | B1 | 5/2002 | Malinoski et al. |
| 2002/0033391 | A1 | 3/2002 | Malinoski et al. |

FOREIGN PATENT DOCUMENTS

| | | |
|---|---|---|
| WO | WO 00/04582 | 1/2000 |

OTHER PUBLICATIONS

The Science Behind Cool Chips™ and Power Chips™ A Basic Introduction, http://www.coolchips.gi/LowWork-FunctionExplanation.shtml, Cool Chips pic Last Updated: Feb. 8, 2002.

Thermo Material May Replace Heat Sinks, Fans in Electronic Gear, By R. Colin Johnson, EE Times, Feb. 24, 2002, http://www.eetimes.com/printableArticle?doc_idxOEG20000224S0014.

A Solid-State Microelectronic Cooler Operating From above Amblent to Cryogenic Temperatures, Paul Cutler, Nicholas Miskovsky (Penn State University, University Park, PA 16802), Moon S. Chung (University of Ulsan, Ulsan, Korea), Nalin Kumar (UHV Technologies, Inc., Mt. Laurel, NJ), http://www.aps.org/meet/MAR01/baps/abs/S7990013.html, Mar. 2001, APS Meeting.

THERMAL CONTROL OF A DUT USING A THERMAL CONTROL SUBSTRATE

FIELD OF THE INVENTION

The present invention is directed generally to thermal control of a device under test (DUT) and specifically to thermal control of a DUT using a thermal control wafer or chip having a plurality of independent thermal elements.

BACKGROUND OF THE INVENTION

Generally, electrical and burn-in testing is frequently carried out on diced packaged or unpackaged semiconductor chips. Tustaniwskyj, et al., U.S. Pat. Nos. 5,821,505 and 5,844,208 describe a procedure to estimate the temperature of diced semiconductor chips based on the measured temperatures of a heat sink and an electric heater interposed between the chip and the heat sink. The estimated temperature is then used to control the heater power and temperature to maintain the chip at a desired temperature during testing.

As semiconductor devices get smaller and the pressure to cut semiconductor processing and testing costs and time has grown, two trends have emerged. The first trend is the increased power dissipation, and hence self-heating of semiconductor devices. A second trend is a drive toward performing device burn-in and electrical testing at the wafer level before the wafer is cut into individual device chips to decrease testing time and cost. However, prior thermal control systems generally do not provide a sufficient amount of temperature control for wafers and high power dissipation chips undergoing electrical and burn-in testing.

SUMMARY OF THE INVENTION

One preferred aspect of the present invention provides a solid state thermal control device, comprising a substrate, and a plurality of solid state thermal elements on the substrate adapted to provide thermal control to a device under test (DUT). Each solid state thermal element comprises at least one solid state heater and a control circuit adapted to control a thermal output of the solid state heater.

Another preferred aspect of the present invention provides a solid state thermal control device, comprising a plurality of first means for providing thermal control to a device under test (DUT) undergoing burn-in or electrical testing, a plurality of second means for providing control of a magnitude of a thermal output of the plurality of first means, and a third means for supporting the plurality of the first means and the second means.

Another preferred aspect of the present invention provides a semiconductor wafer testing system, comprising a thermal control wafer which comprises a semiconductor wafer substrate and a plurality of solid state thermal elements on the substrate adapted to provide thermal control to a wafer under test (WUT). Each thermal element comprises at least one solid state heater and a control circuit adapted to control a thermal output of the solid state heater. The system also comprises an electrical testing or burn-in processing probe located opposite a first side of the thermal control wafer, such that a wafer under test (WUT) location opening is created between the thermal control wafer and the probe, and a thermal reservoir located in thermal contact with a second side of the thermal control wafer.

Another preferred aspect of the present invention provides a method of testing a DUT, comprising placing a first side of a DUT in thermal contact with a thermal control substrate containing a plurality of solid state thermal elements, placing an electrical testing probe in contact with a second surface of the DUT, performing electrical testing or burn-in processing of the DUT, wherein the DUT in an unheated state has at least one of a non-uniform spatial and temporal temperature or power dissipation during the testing, and heating the DUT using the solid state thermal elements such that the DUT has a substantially uniform respective spatial, temporal or spatial and temporal temperature profile during testing.

DETAILED DESCRIPTION OF THE PREFERRED EMBODIMENTS

Figure 1:
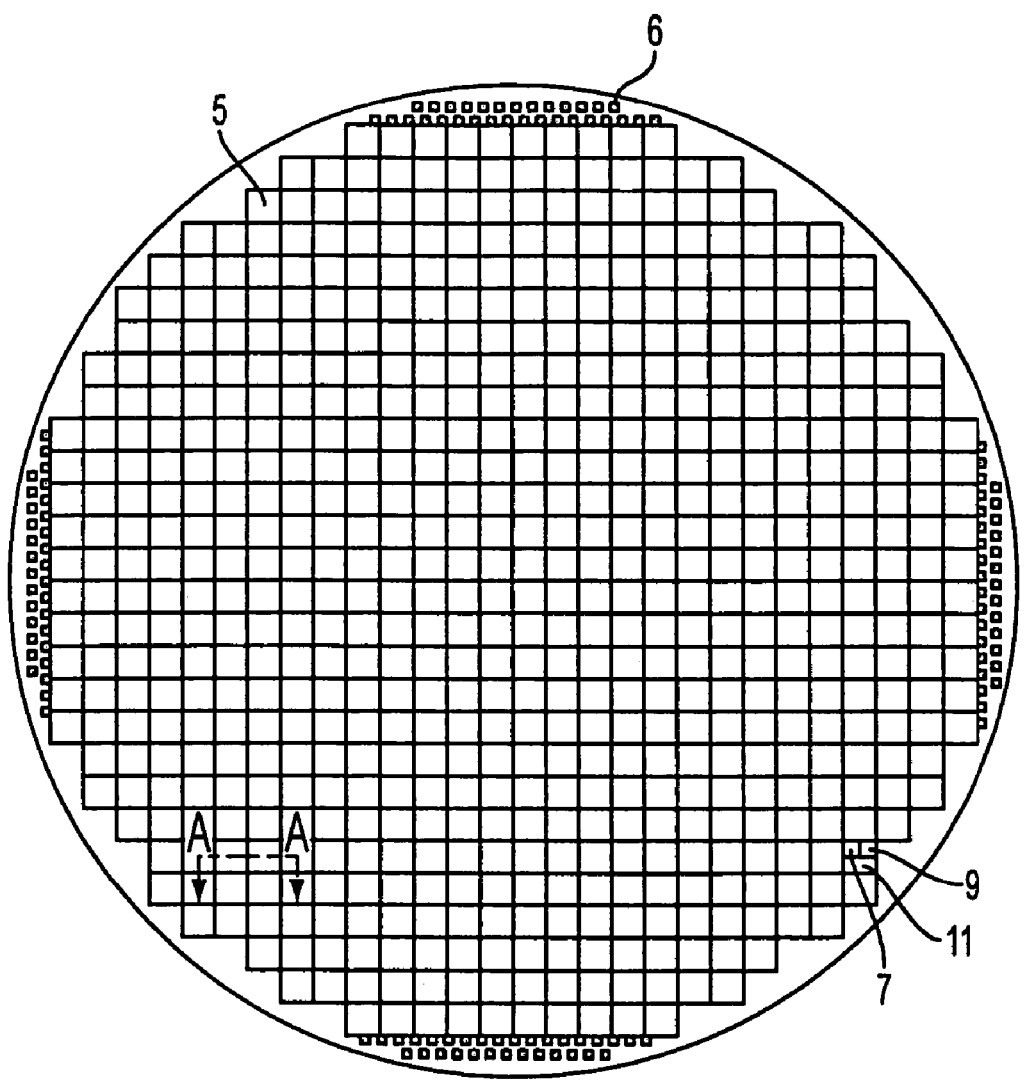
FIG. 1 is a schematic top view of a thermal control wafer according to a preferred aspect of the present invention.

The present inventors have realized that by using a solid state thermal control device in contact with the device under test ("DUT"), allows rapid change and stabilization of the temperature of the DUT, which allows electrical testing and burn-in processing at multiple temperatures. The thermal control device contains a plurality of independent solid state thermal elements which can compensate for inhomogeniety of the DUT power dissipation, thus maintaining a more uniform DUT temperature distribution than the prior art systems.

Preferably, the solid state thermal control device comprises a semiconductor thermal control wafer ("TCW") in thermal contact with the DUT. The DUT preferably comprises an undiced semiconductor wafer under test ("WUT"). Alternatively, the solid state thermal control device may comprise a portion of a TCW, such as one or more thermal control chips, which contain a plurality of solid state thermal elements. Such smaller thermal control device may be used for thermal control of smaller DUTs, such as a packaged device, an unpackaged die or a portion of a WUT undergoing electrical testing or burn-in processing. Thus, the size of the thermal control device is preferably, but not necessarily, selected to be similar to the size of the DUT. The description of the preferred embodiments of the present invention below describes the use of the entire TCW for thermal control of a WUT. However, it should be noted that these embodiments are equally applicable to thermal control of other DUTs, such as packaged devices, unpackaged die or portion of a WUT, using a portion of the TCW, such as a thermal control chip. Also, each thermal element contains one or more solid state heaters, a temperature sensor and an active control circuit, such as an integrated logic circuit which controls a thermal output of the heater by controlling the power dissipated in the heater. However, some or all thermal elements may lack one or more of these components.

During electrical testing or burn-in processing, the TCW is sandwiched between the WUT and a thermal reservoir, such as a liquid cooled thermal chuck. The TCW preferably contains large number of uniformly distributed thermal elements, such as 500 or more thermal elements, preferably 1000 or more thermal elements, most preferably 2000 or more thermal elements. The thermal elements are distributed such that each die or device on the WUT is in thermal contact with one or more thermal elements, such as two or more, and preferably more than ten thermal elements. For example, at least one thermal element on the TCW contacts each die or device on the WUT or the WUT portion. In case of thermal control of a single packaged device or unpackaged die having an inhomogeneous power dissipation, such as microprocessor undergoing electrical testing or burn-in processing, preferably two or more, such as five or more thermal elements contact such a die or device. Each thermal element is addressable by an off-wafer controller via array addressing and a common data bus, or other addressing methods.

The thermal elements on the TCW are arranged such that a "lateral" thermal resistance between adjacent thermal elements is larger than a "vertical" thermal resistances between the TCW and the WUT, and between the TCW and the thermal reservoir. For example, the vertical thermal resistance may be at least two times larger, such as at least four times larger than the lateral thermal resistance. The terms "lateral" and "vertical" are relative terms that depend on the relative position of the TCW and the WUT, which may be arranged in any configuration from parallel to perpendicular relative to the ground. The heat flows are predominantly "vertical," (i.e., between the reservoir, TCW and WUT) and each thermal element can be treated (for thermal purposes) as independent of adjacent thermal elements.

The temperature of the portion of the WUT directly above the thermal element can then be estimated, based on the measured thermal element temperature, the reservoir temperature, and a few calibrated constants. The active control logic circuit of the thermal element adjusts the thermal element's power dissipation in order to maintain the WUT die or device temperature within a few degrees, such as within 3, preferably within 1 degree, from a set point value.

The TCW can maintain a substantially uniform temperature across the WUT during the simultaneous testing of many or all of the WUT die or devices, regardless of whether a die resides on the periphery of the WUT, and regardless of the power dissipation of adjacent die. The TCW also has the capability to rapidly change the set point temperature. Preferably, TCW requires no circuitry or die area on the WUT and it places no additional requirements on the electrical test or burn-in system. Preferably, there is no requirement for synchronization signals or data exchange between the thermal control system and the test or burn-in system. The TCW places no restrictions on the test or burn-in sequencing and its functionality is independent of the details of die size and layout on the WUT. A TCW may be used with any WUT, especially if the thermal element size is smaller than the die size and the distribution of thermal elements spans the area occupied by the WUT die or devices. The TCW functionality is independent of spatial and temporal variation of power dissipation by the WUT. The use of the TCW or a thermal control chip enables Single Insertion Multiple Temperature testing, which is the ability to quickly change the set point temperature of the set of thermal elements without having to handle, disturb, or recontact the DUT or WUT.

Figure 2:
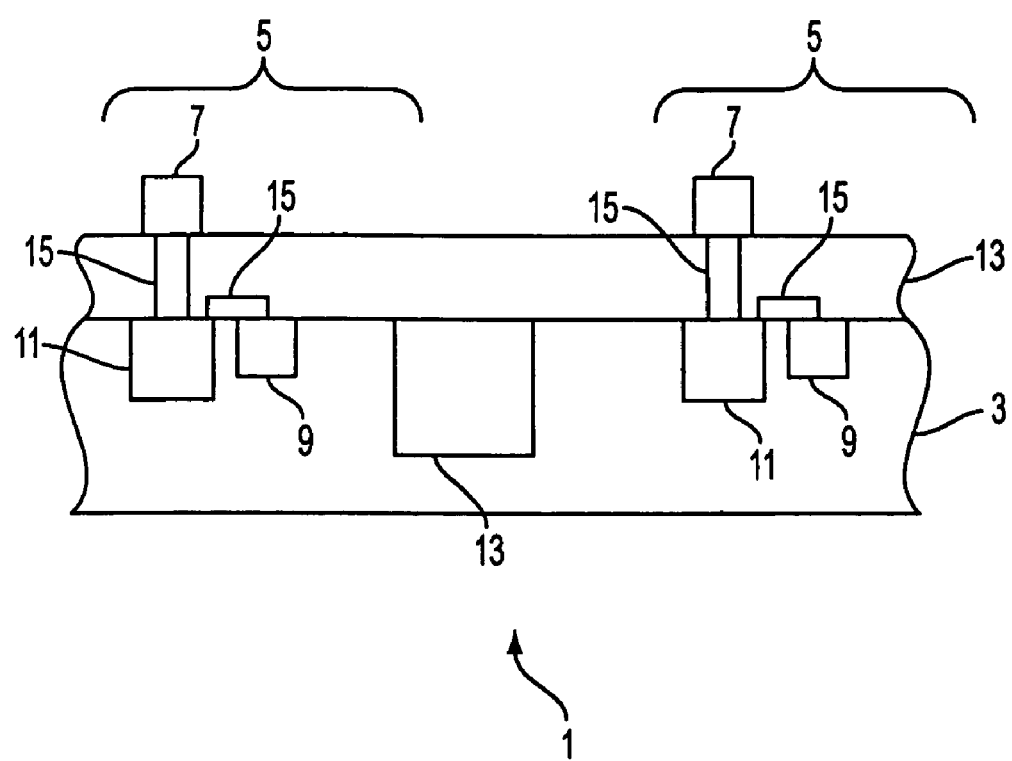
FIG. 2 is a schematic side cross sectional view along line A–A' in FIG. 1.

The Preferred TCW Configuration. FIGS. 1 and 2 illustrate a preferred configuration of a TCW 1. FIG. 1 is a top view and FIG. 2 is a side cross sectional view along line A–A'. The TCW 1 includes a substrate 3 and a plurality of solid state thermal elements 5. Preferably, the entire surface of the TCW 1 is covered by the thermal elements 5, except one or more peripheral regions containing input/output pads 6 and, optionally, related circuitry. For example, for non-decoded array addressing of the thermal elements, the circuitry in the peripheral areas may be omitted. As noted previously, while an entire TCW may be used as a thermal control device, smaller thermal control devices, such as a portion of a TCW or a thermal control chip may be used instead, especially with DUTs that are smaller than a WUT. A thermal control chip contains a plurality of thermal elements 5 shown in FIG. 2.

Preferably, the substrate 3 is a semiconductor wafer, such as a silicon or gallium arsenide wafer. However, the substrate 3 may comprise another material other than semiconductor, such as glass, sapphire, ceramic, high temperature plastic or metal.

The thermal elements 5 are "solid state" in that they contain only solid state devices formed by solid state fabrication techniques, such as thin film deposition (i.e., chemical vapor deposition, sputtering, etc.), photolithography and etching. Preferably, the thermal elements 5 comprise semiconductor devices. The thermal elements 5 are located in and/or over the substrate 3 and are adapted to provide thermal control to a DUT, such as a WUT. Preferably, the components of the thermal elements 5 are semiconductor devices formed in a silicon substrate 3. However, the thermal elements 5 may contain thin film devices, such as resistors and thin film transistors that are located on a non-semiconductor substrate or separated from a substrate by an insulating layer.

The thermal elements 5 are arranged in or over the substrate 3 such that one or more, preferably two or more thermal elements 5, such as ten or more elements 5, are adapted to provide thermal control to one die of the WUT. It should be noted that a "die" is used synonymously with "chip", in that after testing, the WUT is diced and the dies are separated into chips. Thus, when the TCW 1 contacts the WUT, each die of the WUT is in thermal contact with at least one and preferably at least two thermal elements 5. For example, for a WUT containing 500 to 2400 die, the TCW 1 should contain at least 500 to 2400 thermal elements, preferably at least 1000 to 4800 thermal elements 5. The TCW may also be used with a DUT or WUT where the device(s) are not arranged in a separate die layout. The thermal elements 5 preferably extend nearly to the edge of the TCW 1 such that the thermal elements 5 are present outward of the die or device locations on the WUT.

Each solid state thermal element 5 comprises at least one solid state heater 7, at least one optional solid state temperature sensor 9, and at least one active control logic circuit 11. The logic circuit 11 is adapted to control a thermal output of the heater 7, preferably based on input from sensor 9.

The TCW preferably also contains optional thermal isolation regions 13 which substantially thermally isolate adjacent thermal elements 5 from each other. Adjacent thermal elements 5 are "substantially thermally isolated" when a thermal resistance between adjacent thermal elements is at least two times smaller than a thermal resistance between the thermal reservoir, a first thermal element and the adjacent WUT die. The isolation regions 13 may comprise air gap isolation trenches in the TCW substrate 1 that separate adjacent substrate regions containing the solid state thermal elements 5. If desired, the trenches may be filled with low thermal conductivity material, such as silicon dioxide or silicon nitride. Alternatively, the isolation regions 13 may comprise semiconductor regions of lower thermal conductivity than the thermal elements 5. For example, the isolation regions may comprise semiconductor substrate (i.e., Si or GaAs) regions with a disordered crystal lattice or with an amorphous microstructure. Such regions may be obtained by ion implantation damage without a subsequent recovery anneal. Ions such as germanium, oxygen, argon and other noble gas ions may be implanted at a high energy and/or dose into the substrate 3 isolation regions 13 to create implant damage.

The heaters 7 may comprise any solid state devices that are capable of generating heat. Preferably, the heaters 7 comprise integrated circuit resistors. These may be any resistors used in semiconductor devices, such as polysilicon (such as undoped or oxygen doped polysilicon) or metal resistors. The resistors 7 are preferably formed over an interlayer insulating dielectric 13, such as silicon dioxide, silicon nitride, BPSG, etc. The resistors 7 are connected to the active control logic circuits 11 by metal or polysilicon interconnects and electrodes 15 that pass through the dielectric 13.

Alternatively, the heaters 7 may comprise heat pumps which move heat from one region to another. For example, they may comprise solid state thermoelectric or thermionic devices. For example, a Peltier-type thermoelectric device contains a PN junction of p-type and n-type thermoelectric materials. The Peltier device generates heat in one side of the junction and cools the other side of the junction by making electric current flow through the junction. Various thermoelectric materials may be used, such as Bi—Te, Fe—Si, Si—Ge or Co—Sb series materials. These materials may be doped as desired, such as Bi—Te doped with cesium or other dopants, for example (see R. Colin Johnson, *EE Times*, Feb. 24, 2000, incorporated herein by reference).

In a thermionic device, electrons are emitted from a cold side electrode toward a hot side electrode upon an application of a voltage between the electrodes. The electrons carry energy away from the cold side electrode to the hot side electrode. It has been reported by researchers at University of California, Santa Barbara that thermionic emission may occur over a band gap discontinuity in a Si—Ge—C superlattice to remove heat from optical components (see D. Vashaee, et. al., "Heterostructure Integrated Thermionic Coolers," available at the *www.cse.ucsc.edu* website, incorporated herein by reference). Alternatively, an electron field emission device using wide band gap materials, such as diamond or Group III-Nitride material (i.e., GaN) deposited on Si or metallic substrates, may be used as a heater. These materials have been reported by researchers from Penn State University for in-situ cooling by pumping heat away from localized hot spots on a cathode to an anode that is in contact with a thermal bath, all on the same side of the wafer (see Paul Cutler et. al., March 2001 APS meeting, session W9, incorporated herein by reference).

Alternatively, the heaters 7 may comprise other heat pumps, such as Stirling cooler microelectromechanical devices. In these devices, gas is forced by piezoelectric elements between two chambers separated by a porous plug to extract heat from a first chamber and expel heat from the second chamber.

The temperature sensors 9 may comprise any solid state device that is adapted to measure its ambient temperature. For example, the temperature sensors 9 may comprise CMOS or thermal diode temperature sensors formed in or above the substrate 3. Sensors 9 are connected to circuits 11 by electrodes 15.

Figure 3:
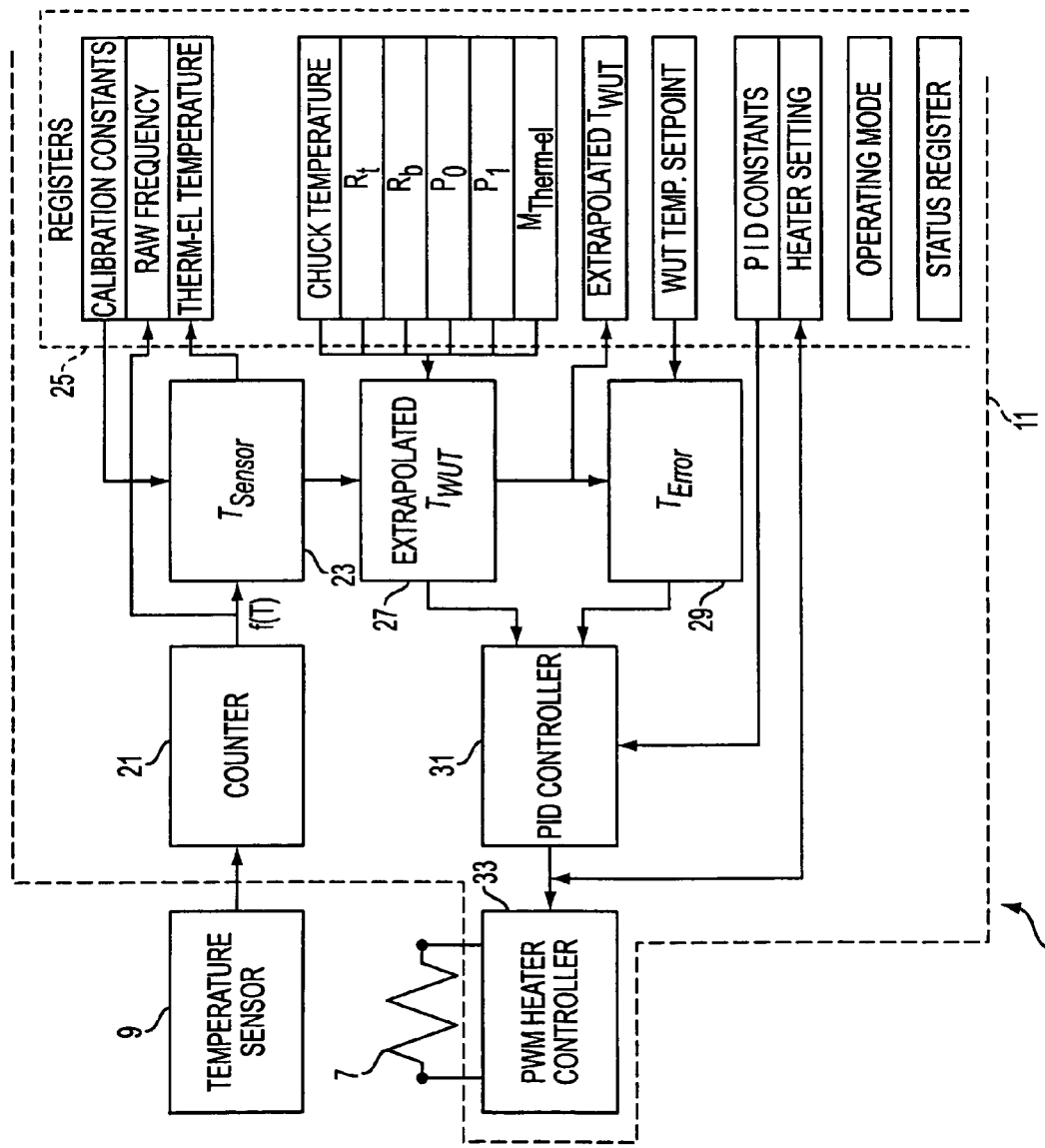
FIG. 3 is a circuit schematic of a thermal element located on the thermal control wafer according to a preferred aspect of the present invention.

The active control logic circuits 11 may comprise any suitable analog or digital logic circuits that are adapted to control the heater 7 output. Digital logic circuits are preferred. A simplified diagram of a thermal element 5 with the details of a preferred logic circuit 11 is shown in FIG. 3. Other logic circuits may be used instead if desired.

The temperature measured by sensor 9 is provided as a signal whose frequency is a function of the measured temperature. The counter 21 provides a digital representation of the frequency. Element 23 applies calibration constants to convert the measured frequency to a digital value for the sensor temperature. Elements 9 and 21 provide the only A/D conversion required.

The circuit 11 also contains a plurality of registers 25. The registers are connected via an external bus interface (not shown in FIG. 3) to an external controller (not shown), preferably located off the TCW 1. The external controller proves the read/write commands to the circuit 11. The register 25 functions are summarized in the table below.

| Register Name | Register Function |
| --- | --- |
| Calibration Constants | Provides coefficients in the T = f(frequency) equation. Used internally to compute the local temperature. Provides output to temperature computing circuit element 23. |
| Raw Frequency | Stores signal frequency generated by the temperature sensor 9. Receives input from counter 21. Accessible to the external controller for calibration purposes. |
| Therm-el element Temperature | Stores computed local temperature provided by element 23. Available for external access. |
| Chuck Temperature | Stores information regarding thermal chuck temperature supplied by the external controller. Used for computation of WUT temperature. |
| $R_t$ | Stores vertical thermal resistance between WUT device circuitry and thermal element 5 circuitry. |
| $R_b$ | Stores vertical thermal resistance between thermal element circuitry 5 and the thermal chuck. |
| $P_0$ | Stores the 'idling' power dissipation of the thermal element 5. |
| P1 | Stores the thermal element power dissipation coefficient: $P = P_0 + (P_1) \times$ (Heater Setting) |
| $M_{therm-el}$ | Stores the thermal mass of the thermal element. |
| WUT Temp. Setpoint | Stores target or set point WUT temperature. |
| Extrapolated $T_{WUT}$ | Receives computed temperature of the section of the WUT immediately above the thermal element 5 containing circuit 11. |
| PID Constants | Stores constants used for tuning the feedback network. |
| Heater Setting | In automatic mode this register holds the output of the feedback PID controller. In manual mode, it serves as the input to the heater controller. |
| Operating Mode | Stores operating mode (i.e., automatic, manual, etc.) of the thermal element 5 provided by the external controller. In manual mode, heater 7 power is manually set, while sensors 9 and circuits 11 are active. In automatic mode, heater power is set by circuit 11. |
| Status Register | Stores status bits (e.g. "Sensor Temperature out of range", etc.). |

The circuit 11 may contain other optional registers 25, such as $T_{Sensor\ limit}$ which provides protection against overheating the thermal element 5. If the measured temperature exceeds a predetermined limit, then the thermal element is shut down and the 'over temperature' status bit is set. Another optional register may provides guard band limits on extrapolated $T_{WUT}$. If limits are exceeded, a status bit is set.

Preferably, some or all register 25 values or data are stored non-volatilely in the thermal elements 5. This storage may be accomplished by adding a non-volatile memory (i.e., mask ROM, EPROM, EEPROM, etc.) into each thermal element 5. However, if desired, the register 25 data may be stored in a memory device located off the TCW 1 or in a central memory located in one portion of the TCW. Alternatively, the register data may be recalculated and reentered into the registers 25 rather than being stored in memory.

The output of the "Chuck Temperature" to "$M_{therm-el}$" registers is provided into the Extrapolated $T_{WUT}$ circuit element 27. Element 27 determines the extrapolated temperature of the portion of the WUT located adjacent to particular thermal elements 5. Element 27 makes this determination based on the local sensor temperature (provided by element 23) and based on the data provided from the registers 25. Element 27 outputs the extrapolated WUT temperature to the Extrapolated $T_{WUT}$ register and to the error measurement circuit element 29.

The error measurement circuit element 29 compares the extrapolated WUT die temperature to a set point temperature stored in register 25 and determines if the extrapolated WUT die temperature deviates from a set point temperature by more than a certain amount, such as 1 to 3 degrees Celsius. Element 29 outputs a signal to a PID controller 31 indicative of whether extrapolated WUT die temperature deviates from the set point temperature by more than the desired amount.

The PID feedback controller 31 receives signals from elements 27 and 29, and determines if the heater 7 thermal output or temperature (which is a function of heater power output) should be increased or decreased. The controller 31 then sends a signal to a PWM heater controller 33 to change or maintain the heater 7 power output. It should be noted that in the digital feedback control circuit, the PID controller 31 regularly adjusts its output, regardless of the magnitude of the error. For example, the instantaneous error may equal to zero, but the time derivative of the error may equal to non-zero. The derivative term of the loop equations will still drive a corrective output term.

Each circuit 11 is adapted to actively control a magnitude of the thermal output of a heater 7 located in the same thermal element 5 on the substrate 3. If desired, each thermal element 5 may contain two or more heaters 7. In this case, one control circuit 11 is adapted to actively control a magnitude of the thermal output of two or more heaters 7.

Since the TCW 1 contains a plurality of thermal elements 5 containing heaters 7 and control circuits 11, each circuit 11 allows independent control of the magnitude of the thermal output of a respective heater 7 based on the estimated temperature of a WUT region in thermal contact with a respective thermal element 5. Thus, each WUT region may be maintained at a temperature that differs from a set point temperature by less than the desired amount.

The thermal output of the heaters 7 of the thermal elements 5 may be continuously or intermittently adjusted based on temperature measured by the plurality of temperature sensors 9. Continuous adjustment is preferred.

The plurality of thermal elements 5 are adapted to provide different thermal outputs to maintain a WUT with non-uniform spatial power dissipation during electrical testing or burn-in processing at a substantially uniform temperature during this testing. A substantially uniform temperature varies by about 4° C. or less, preferably 2° C. or less, across the WUT active area. Thus, the thermal elements 5 are controlled to minimize temperature gradients across the active area of the WUT. The thermal elements 5 provide complementary power dissipation to the WUT. For the WUT die where power dissipation is small or absent (i.e., inoperative die or low power dissipation die), the adjacent thermal elements 5 in contact with these die are maintained at a high power (i.e., high temperature). For the WUT die where power dissipation is high, the adjacent thermal elements 5 in contact with these die are maintained at a lower power (i.e., lower temperature). Alternatively, if it is desirable to maintain different WUT die at different temperatures during the electrical testing or burn-in processing, then the thermal output of the heaters 7 in different thermal elements 5 may be adjusted accordingly.

Likewise, the plurality of thermal elements 5 are adapted to provide different thermal outputs to maintain a WUT with non-uniform temporal power dissipation during electrical testing or burn-in processing at a substantially uniform temperature during this testing. As the power dissipation of the WUT die increases and decreases over time, the thermal output of the heaters 7 of the thermal elements 5 is complementarily adjusted over time to maintain the WUT die at a substantially uniform temperature. Alternatively, if it is desirable to vary the WUT die temperature over time during the electrical testing or burn-in processing, then the thermal output of the heaters 7 may be adjusted accordingly.

Figure 4:
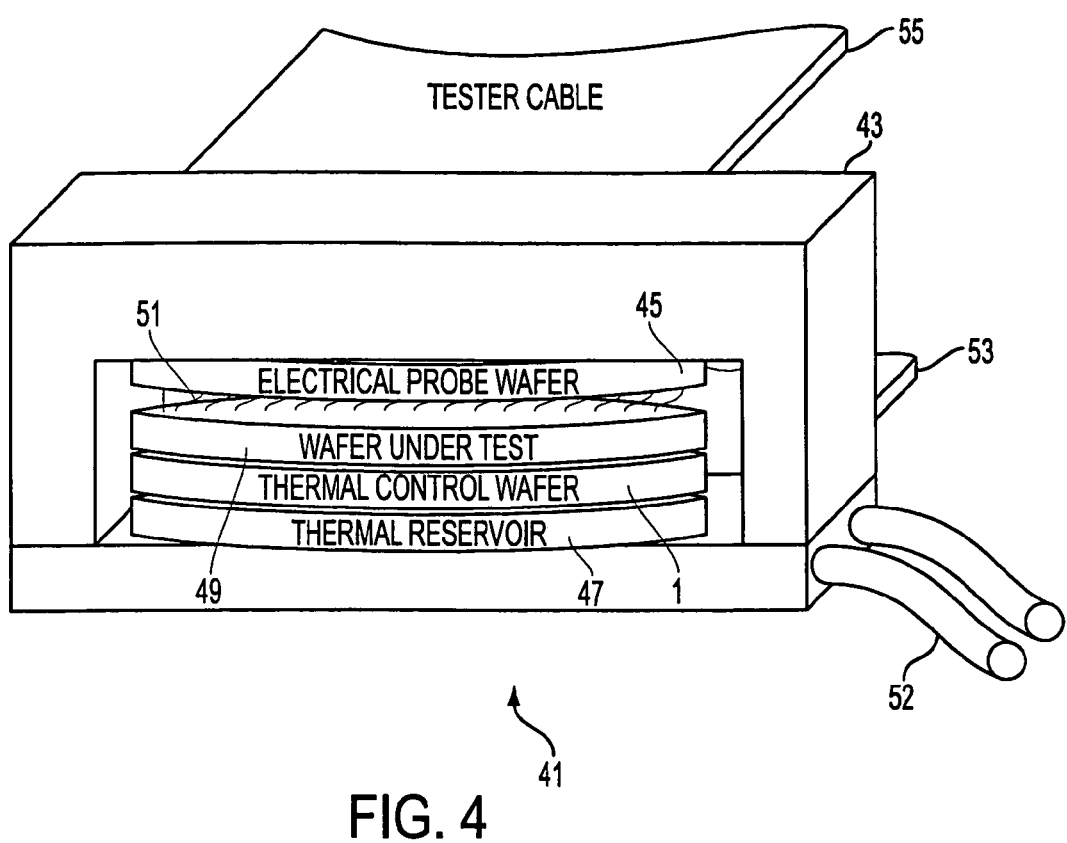
FIG. 4 is schematic three dimensional view of a thermal control system which includes the thermal control wafer according to a preferred aspect of the present invention.

The Preferred Thermal Control System. FIG. 4 illustrates a semiconductor wafer testing system 41 that includes the TCW 1, according to a preferred embodiment of the present invention. The system 41 includes a housing 43, which contains the TCW 1, an electrical testing or burn-in processing probe 45 and a thermal reservoir 47. Any suitable housing 43 may be used.

The electrical testing or burn-in processing probe 45 is located opposite to a first side of the TCW 1, such that a wafer under test (WUT) 49 location opening is created between the TCW 1 and the probe 45. A first side of the WUT 49 is placed in thermal contact with the TCW 1, while the probe 45 makes an electrical connection with electrical outputs on the second side of the WUT 49. If desired, the system 41 may be used to test packaged and unpackaged chips and other DUTs instead of WUTs 49. Preferably, the probe 45 is located over the TCW 1. However, if desired, the TCW 1 may be located over the probe 45, or the TCW 1 and the probe 45 may be positioned in any configuration from vertical to horizontal.

The probe 45 may comprise any probe suitable for electrical testing or burn-in processing. Preferably, the WUT is mounted with a full-wafer testing probe 45 contactor in a 'cassette' assembly that takes it through burn-in and electrical testing. Preferably, the probe 45 is adapted to perform simultaneous electrical testing or burn-in processing on a plurality of die of an undiced WUT. Most preferably, microspring contactors 51 are fabricated on, and are permanently attached to the WUT 49. The probe 45 comprises a wafer whose contact surface is an array of flat contact pads that press against the free ends of the microspring contactors 51. After the WUT 49 is diced into chips, the microspring contactors 51 remain on the chips and connect the chips to the next level of package. One such probe 45 is provided by FormFactor Inc., which calls such probes MicroSpring on Silicon Technology ("MOST"). Alternatively, the microspring contactors 51 may be mounted on the probe wafer 45 rather than on the WUT 49, provided that the WUT 49 has the complementary contact pads. Alternatively, an indexing wafer prober may be used as the probe 45.

Thus, the system 41 provides a "wafer on wafer on wafer" configuration, since the DUT is preferably a wafer 49, the probe 45 is preferably a wafer and the thermal control device 1 is also a wafer. Most preferably, the three wafers have about the same size, such that all die on the WUT 49 may be heated and tested at the same time.

The thermal reservoir 47 preferably comprises any suitable thermal chuck. Preferably, a coolant fluid, such as water, is provided into the thermal chuck through coolant hoses 52. Other thermal reservoirs, such as coolant pipes or coolant vessels may be used instead. The thermal reservoir 47 is located in thermal contact with a second side of the thermal control wafer 1 which does not contact the WUT 49. In a preferred aspect of the present invention, the thermal elements 5 are located on the second side of the TCW 1 which contacts the thermal reservoir 47. The thermal elements 5 provide thermal control to the WUT 49 through the thickness of the TCW 1.

A central controller (not shown in FIG. 4) is located remote from the thermal control wafer 1. The controller may be a general or special purpose computer or a logic chip, such as an ASIC. Preferably, the controller is located outside of the housing 43. The controller is used to provide control signals to the control circuits 11 located on the thermal control wafer 1 through a thermal control cable or wire 53. The electrical testing or burn-in control signals are provided to the probe 45 through a tester cable 55. The electrical testing or burn-in control signals may originate from the same controller as the thermal control signals or from a different controller, as desired.

The off-wafer controller may communicate with the thermal elements 5 on the TCW 1 via the cable or wire 53 using any suitable method. Depending on the control scheme, the communication may be real-time or near-real-time. Direct input/output ("I/O") to each individual thermal element is possible, but expensive. Thus, a serial or parallel I/O technique preferred.

One preferred communication technique is a serial shift scheme, such as a JTAG or a similar technique. Each thermal element has at least one shift register, and preferably more than one shift register for JTAG. The thermal elements are serially connected in one or more 'daisy chains' connecting the shift registers. A small number of global control signals govern the operation of the shift chains. The advantage of this technique is that it is based on a mature technology with standard on-wafer and off-wafer components, and that it minimizes I/O to the TCW.

Alternatively, an array addressing technique may be used instead. In this technique, the TCW is spanned with an array of Row Select and an array of Column Select lines. Each thermal element has a Row Select and a Column Select input. A data bus, such as a modest 8–10 bit bus, spans the entire TCW, tying into each thermal element. These lines and the bus are used to activate and deactivate the thermal elements, convey setpoints and calibration constants, query temperature and status and perform other functions.

It is desirable to minimize the number of electrical I/O to the TCW. For example, Row and Column address decoders on the TCW can address a 128×128 array with 7+7=14 I/O, as compared to the 256 I/O required for non-decoded addressing. The use of a third addressing dimension also cuts the required number of I/O in a non-decoded scheme. For an N×N square array of elements, the number of required I/O is minimized if each addressing axis has $N^{2/3}$ bits. For example a 128×128 array may be addressed with 77 I/O instead of the 256 I/O required in two dimensional addressing. The elements can be arranged in 25 groups, each group having 26 rows×26 columns. This grouping of elements can be advantageous when large segments of the TCW must be addressed simultaneously. Since the TCW surface is covered by thermal elements that correspond to all WUT die or devices, the decoders are also preferably located at the periphery of the TCW adjacent to the I/O pads 6.

If desired, additional measures may be taken to reasonably minimize noise generation in the TCW. These measures may include counterwound resistor heaters 7 to minimize radiation, tuning rise and fall time for the heater current, shielding by ground and/or power planes and running the heater off a relatively high (for example 50V) voltage supply to minimize current switching.

Figure 8:
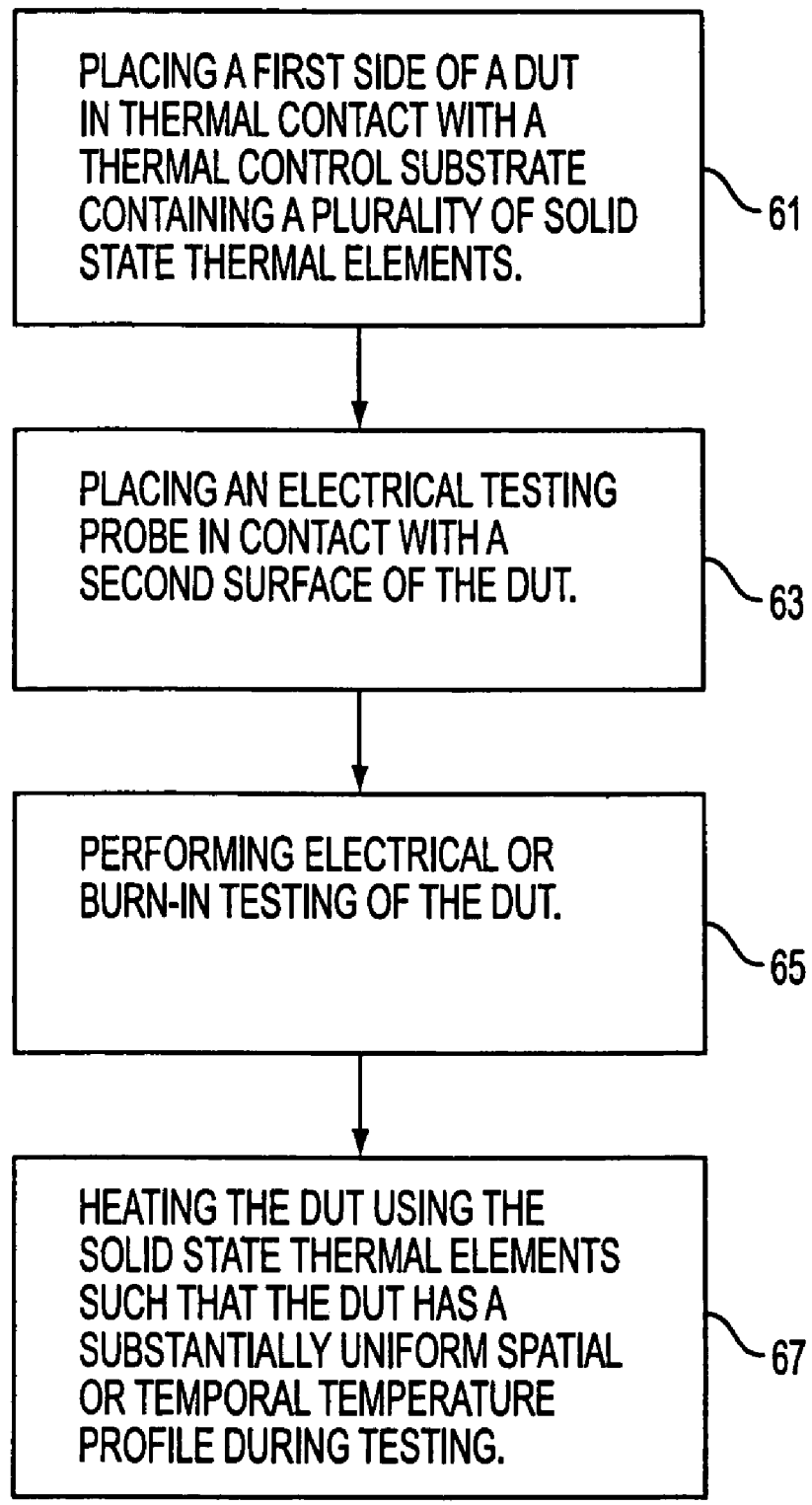
FIGS. 8–12 are flow charts of thermal control methods according to the preferred embodiments of the present invention.

The Preferred DUT Temperature Control Methods. A method of testing a DUT using a wafer testing system 41 will now be described with respect to FIG. 8. A first side of a DUT, such as a back side of a WUT 49, is placed in thermal contact with a first side of a thermal control substrate, such as the TCW 1 or a thermal control chip (step 61). The second side of the thermal control substrate is placed in contact with the thermal reservoir 47. An electrical testing probe 45 is placed in contact with a second surface of the DUT 49 (step 63). Electrical and/or burn-in testing of the DUT is then performed (step 65), while heating the DUT 49 using the solid state thermal elements 5 on the TCW to provide a substantially uniform spatial and/or temporal temperature profile for the DUT (step 67), even when the unheated DUT has a non-uniform spatial or temporal temperature or power dissipation during the testing.

Any suitable thermal element control method may be used to set and adjust the heater temperature. The control algorithm preferably makes use of directly measured or indirectly inferred information of the thermal or power dissipation behavior of the WUT. In a first preferred embodiment, the algorithm uses extrapolated WUT temperatures. The WUT temperatures are extrapolated based on measured thermal element temperatures and a calibrated thermal model of the WUT/TCW/reservoir system.

In a second preferred embodiment, the method uses anticipated WUT power dissipation over time. The particular WUT die or device temperatures are assumed to vary proportional to the power dissipation by the particular die or device. The temporal (i.e., time) profiles of thermal element heater powers are stored in memory and then applied, based on anticipated WUT power dissipations. It is assumed that WUT device or die power dissipation can be realistically modeled as a piecewise constant. In a third preferred embodiment, the method uses direct feedback of the actual WUT device or die temperature. This embodiment requires a WUT containing temperature sensors located on the WUT itself. In a fourth preferred embodiment, the method uses direct feedback of the actual WUT device or die power dissipation. This embodiment requires feedback from the electrical testing or burn-in system. In a fifth preferred embodiment, the thermal control elements are simply set to a predetermined temperature.

The Method Of The First Embodiment. The thermal element control method according to the first preferred embodiment will now be described with respect to FIG. 9. The WUT temperature is extrapolated using a simplified thermal model. This method includes individually measuring a temperature of thermal elements 5 using temperature sensors 9 located on the TCW 1 (step 71), and extrapolating the temperature of the adjacent WUT region from these measurements (step 75). The temperature is preferably controlled in a closed feedback loop for each thermal element.

The measured temperature data is provided to the plurality of logic circuits 11 (step 73). Preferably, each temperature sensor 9 provides data to the circuit 11 located in the same thermal element 5, as described with respect to FIG. 3 above. The temperature sensor 9 output, a continuous waveform whose frequency varies with temperature, is provided into a counter 21 of the circuit 11. The counter 21 measures the frequency of the signal from element 9. The counter's output is provided into a temperature computing circuit element 23. Element 23 provides a digital representation of the temperature of the sensor.

Figure 9:
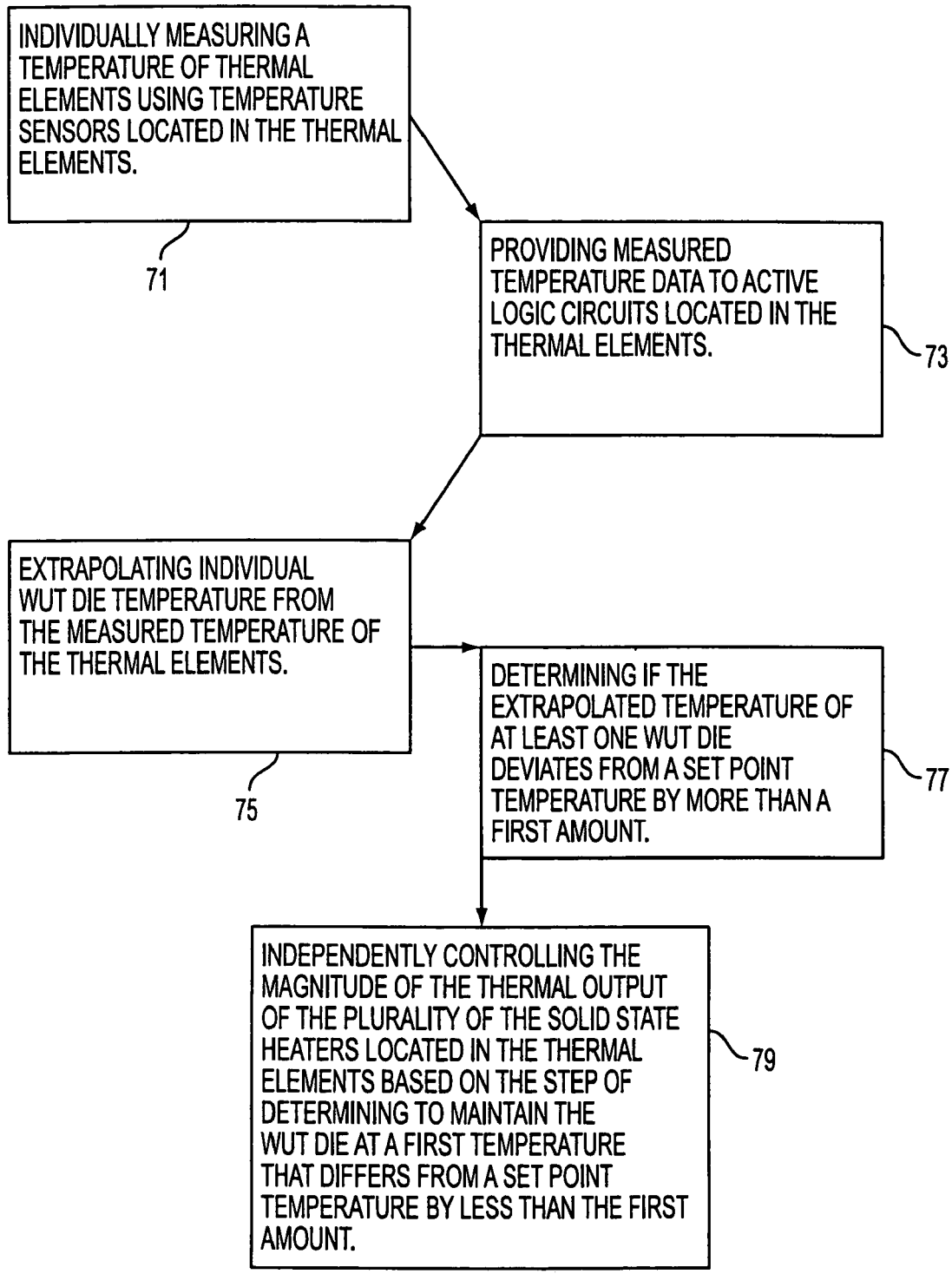

The circuit 11 determines if the temperature of the adjacent region of the WUT deviates from a set point temperature by more than a given amount, such as 1–3 degrees Celsius (step 77 in FIG. 9). Specifically, the extrapolated $T_{WUT}$ element 27 determines the extrapolated temperature of the WUT region located adjacent to the thermal element 5. The error measurement circuit element 29 compares the extrapolated WUT die temperature to a set point temperature stored in register 25 and determines if the extrapolated WUT die temperature deviates from a set point temperature by more than a desired amount, such as 1 to 3 degrees Celsius. Element 29 outputs a signal to a PID controller 31 indicative of whether extrapolated WUT die temperature deviates from the set point temperature by more than the desired amount.

The PID feedback controller 31 receives signals from elements 27 and 29, and determines if the heater 7 thermal output or temperature (which is a function of heater power output) should be increased or decreased. The controller 31 then sends a signal to a PWM heater controller 33 to change or maintain the heater 7 power output. It should be noted that the PID controller 31 regularly updates the PWM heater controller 33, and generally does not have a threshold limit on the temperature error term.

Thus, the TCW 1 independently controls the magnitude of the thermal output of the plurality of the solid state heaters 7 based on the measured temperature to maintain the WUT die at a first temperature that differs from a set point temperature by less than the predetermined amount (step 79 in FIG. 9). The measured temperature data is continuously provided to a plurality of logic circuits 11, which continuously individually control the magnitude of the thermal output of one or more heaters 7 located in a same thermal element 5 as a given logic circuit 11.

Figure 5:
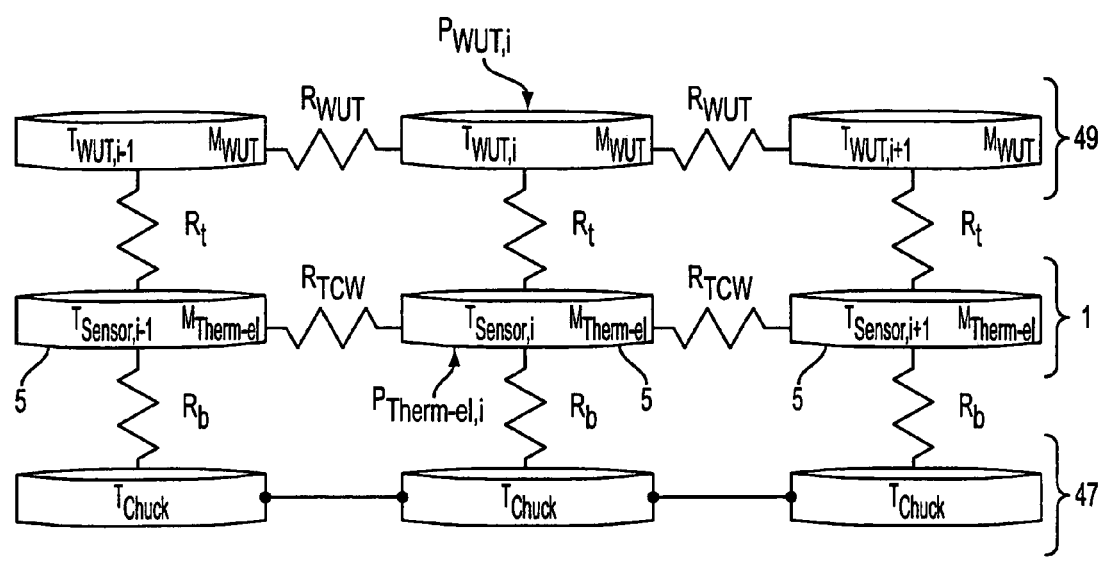
FIG. 5 is a schematic representation of thermal resistances between the elements of the system shown in FIG. 4.

FIG. 5 schematically illustrates a simple two dimensional model of a TCW 1 sandwiched between a WUT 49 and an isothermal thermal chuck 47. The wafers 1, 49 are subdivided into sections (i−1, i, i+1) corresponding to individual thermal elements on the TCW 1. These sections are interconnected by thermal resistances. The symbols in FIG. 5 are summarized in the table below.

| | |
|---|---|
| $R_t$ | The thermal resistance from the top side of a WUT 49 section (where the tested devices or die lie) to the bottom side of the corresponding TCW 1 section (where the thermal elements reside). It includes the thermal resistance of the bulk wafer material (such as silicon, GaAs, etc.) in the WUT and the TCW, plus the contact resistance between the two wafers. |
| $R_b$ | The thermal resistance from the bottom side of the TCW 1 section to the thermal chuck 47, (i.e., essentially the contact resistance between the two). |
| $R_{WUT}$ and $R_{TCW}$ | The section-to-section lateral thermal resistance in the two wafers 1, 49. |
| $P_{WUT,i}$ | The power dissipated in the i$^{th}$ WUT section. |
| $P_{therm-el,i}$ | The power dissipated by the i$^{th}$ thermal element 5, including both the normal operating power and the power provided to the heater 7. |
| $T_{WUT,i}$ and $T_{Sensor,i}$ | The temperatures of the i$^{th}$ WUT section and TCW section (i.e. $T_{Sensor,i}$ is the temperature measured by sensor 9 located in the thermal element). |
| $M_{WUT}$ and $M_{therm-el}$ | The heat capacities of a WUT 49 section and of a thermal element 5, respectively. |

The power dissipated by each thermal element, $P_{therm-el,i}$ is controlled to maintain all the $T_{WUT,i}$ at a substantially fixed setpoint temperature, $T_{set}$. For the purposes of simplifying the algorithm, the horizontal heat flows can be ignored in a preferred embodiment where the WUT 49 contains a plurality of die or devices, where all the $T_{WUT,i}$ are approximately the same, regulated to be at $T_{Set}$. Hence the heat flows through the $R_{WUT}$ are nearly zero. Furthermore, the TCW 1 preferably contains isolation regions 13 which substantially thermally isolate adjacent thermal elements 5 from each other. Hence, negligible heat flows through the horizontal TCW resistances $R_{TCW}$, because the $R_{TCW}$ are large in comparison to the vertical resistances $R_t$ and $R_b$, even when the temperatures of different thermal elements, $T_{Sensor,i}$, are not equal.

Another simplifying assumption is that there is negligible heat flow from the WUT 49 to the ambient. With these simplifying assumptions, each vertical section can be treated independently, and its behavior can be described following the method provided in U.S. Pat. No. 5,844,208 using the following two basic thermal relationships. The first relationship is that the heat flowing from one object to another (P) is proportional to the difference in their temperatures, P=ΔT/R, where R is the thermal resistance between the two objects. The second relationship is that the net heat ($P_{Net}$) flowing into an object causes the object's temperature to change at a rate inversely proportionally to the thermal mass of the object $$\dot{T} = \frac{P_{Net}}{M}.$$

The net heat flow equation for each thermal element 5 is provided by equation (1):

$$P_{Therm-el,net} = \qquad (1)$$
$$M_{Therm-el}\dot{T}_{Sensor} = \frac{T_{WUT} - T_{Swnsor}}{R_t} + \frac{T_{Chuck} - T_{Sensor}}{R_b} + P_{Therm-el}$$

Equation (1) can be rewritten as equation (2) to prove an estimate for the temperature of a given WUT section, $T_{WUT}$:

$$T_{WUT} = T_{Sensor} + R_t\left[M_{Therm-el}\dot{T}_{Sensor} + \frac{T_{Sensor} - T_{Chuck}}{R_b} - P_{Therm-el}\right] \qquad (2)$$

The power to the heater 7 in a given thermal element 5 is modulated make the error term, E, as close to zero as possible:

$$E = T_{WUT} - T_{Set} = \qquad (3)$$

$$T_{Sensor} - T_{Set} + R_t \left[ M_{Therm-el} \dot{T}_{Sensor} + \frac{T_{Sensor} - T_{Chuck}}{R_b} - P_{Therm-el} \right]$$

The thermal element temperature, $T_{Sensor}$, is monitored and its time derivative is computed. The set point and chuck temperature $T_{Set}$, $T_{Chuck}$, are known and it is assumed that the chuck is well calibrated for temperature. The thermal element power dissipation, $P_{therm-el}$, is determined after a calibration. Hence, equation (3) is used as a basis of the control algorithm. For example, whenever $T_{WUT}$ differs from $T_{set}$ by more than a given amount, such as 1–3 degrees Celsius, for example, (i.e., E>3) the heater 7 power is modulated until E≦3. The value of the error term E may be selected by the user based on the desired degree of temperature control.

The constants in equation (3) may be determined from a calibration as follows. The thermal element heater power dissipation can be calibrated by putting a thermal element in its 'manual' mode of operation (heater power is manually set, while the temperature sensors 9 and temperature control circuits 11 are active). The power provided by the off-wafer heater power supply is monitored as a function of the heater setting. The 'idle' power dissipation (no power dissipation in the heater) of a thermal element can be measured by putting the thermal element in its manual mode and monitoring the power provided by the off-wafer logic power supply.

The TCW temperature sensors 9 can be calibrated and $R_b$ can be determined by the following method. The thermal elements are placed in the 'manual' mode and the thermal chuck temperature is set. The sensor frequency, $f_{Sensor}$, (assuming the use of a temperature to frequency sensor described above) is measured against $P_{therm-el}$ for various heater power settings and then extrapolated to $P_{therm-el}=0$ to determine the frequency of the sensor for a given chuck temperature, $f_{Sensor}(T_{Chuck})$. These steps are then repeated for other chuck temperatures. Then, the coefficients of the $T(f_{Sensor})$ relationship are extracted. With the these coefficients available, the $f_{Sensor}$ vs. $P_{therm-el}$ data determined previously is plotted as a line on a $T_{Sensor}$ vs $P_{therm-el}$ plot. The slope of this line is $R_b$.

$R_t$ is generally not measured in situ unless the WUT has calibrated temperature sensors and a means to monitor power dissipation. $R_t$ may be determined using several methods. For example, it may be assumed that the contact resistance from WUT to TCW is the same as that from TCW to the chuck. Then, $R_t$ is equal to $R_b$ plus the combined bulk thermal resistances of the WUT and the TCW. Alternatively, the WUT is replaced with a with a calibrated TCW. Then the upper and lower TCW temperatures are monitored while controlling the power input to the upper TCW. The slope of the $\Delta T$ vs P line is $R_t$. This method assumes the TCW-to-TCW interface closely approximates the WUT-to-TCW interface.

The thermal mass of a thermal element, $M_{therm-el}$ is preferably the same for all thermal elements on a given TCW, and most preferably on all TCWs. This thermal mass can be estimated based on the specific heat of the constituent materials and the geometry of the thermal element. Alternatively, the thermal mass can be measured by thermally isolating a TCW and measuring $T_{Sensor}$ before and after the application of a known amount of heat through the heater.

The thermal element control method according to the first preferred embodiment (i.e., the extrapolated WUT temperature method) is advantageous for several reasons. First, it does not require assumptions on the time dependence of the WUT power dissipation. Second, it does not require a map of active/inactive WUT devices. However, such a map would be beneficial when only a portion of the WUT undergoes simultaneous testing. In this case, only the thermal elements immediately under and bordering active WUT devices are activated, thereby reducing the total system heat load. Third, the method does not require synchronization signals from the test system and allows a fairly simplified control algorithm with all thermal elements independent of each other. Fourth, the control method can easily be adjusted to regulate the local, thermal element temperature instead of regulating the extrapolated WUT temperature. As seen in equation (3) above, if $R_t$ is set to zero, then the error term of the control loop, E, is simply $T_{Sensor}-T_{Set}$. Fifth, thermal element alignment with die or devices on the WUT is not critical. The thermal element simply attempts to keep that portion of the WUT immediately adjacent to it at a fixed temperature, regardless of whether that part of the WUT is dissipating power. However, it may be advantageous to establish a mapping from thermal element to WUT die or devices in order to notify the test or burn-in system which WUT die or devices had thermal elements that reported failure (overheat, outside allowed range, etc).

Figure 10:
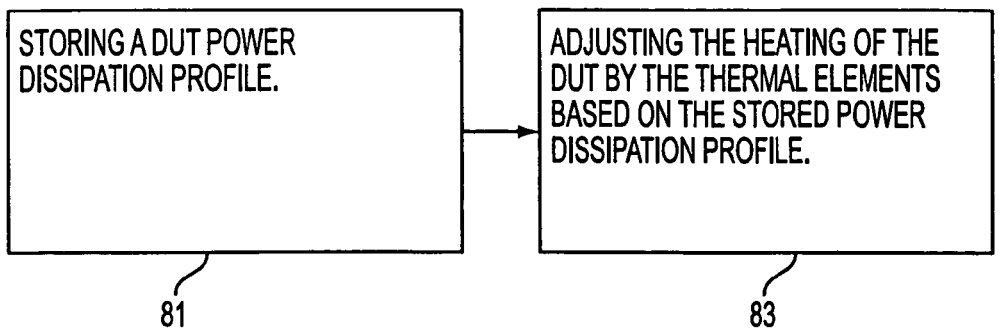

The Method Of The Second Embodiment. The thermal element control method according to the second preferred embodiment will now be described with respect to FIG. 10. This method uses stored profiles of WUT power dissipations (step 81) to control the thermal output of the thermal elements (step 83). In this preferred embodiment, it is assumed that the power dissipation of the active WUT devices can be reasonably represented as piecewise constant in time and that the electrical testing or burn-in system can provide a synch signal to indicate the transition from one segment to the next segment of the piecewise constant power dissipation curve. The control method of the second preferred embodiment is simpler than the method of the first embodiment because it may be operated in open loop instead of closed loop control. Furthermore, if desired the active control circuits 11 and the temperature sensors 9 of the thermal elements 5 may be replaced with passive control circuits, thus simplifying the thermal element 5 structure and operation.

Given the above assumptions, and an assumed/measured relationship of $R_t$ and $R_b$ described with respect to the first embodiment, the thermal elements may be regulated in order to minimize temperature gradients across the active area of the WUT 49. The thermal elements 5 provide complementary power dissipation where WUT dissipation is small or absent. Each thermal element 5 is pre-programmed with a sequence of desired heater powers. During testing, the test or burn-in system provides a synch signal to the thermal control system 41 each time the test power dissipation transitions from one constant power level to another. The thermal control system broadcasts the synch signal to the thermal elements, which change their heater 7 power according to the pre-loaded sequence.

One method of determining power profiles relies on a precursor sequence run by the test or burn-in system. During the precursor sequence, all the thermal elements are set to zero heater power and the WUT die or devices are operated at a constant power. The temperatures of all thermal elements that are in the region of interest are measured and acquired by the off-wafer thermal system controller. Based on a thermal model of the WUT/TCW/chuck system shown in FIG. 5 or another similar model, the thermal system controller computes, for each thermal element, the heater power required to keep the WUT temperature uniform across the region of interest. This computation may be performed off TCW and does not need to be performed in real time. Once the thermal element heater powers are determined from the precursor sequence, the heater powers for the various segments of the piecewise continuous power vs. time curve are scaled proportionally against the precursor results.

In another method determining power profiles, a wafer map rather than the precursor test sequence is used. In this method, a uniformity of power dissipation across the active WUT die or devices is assumed. A mean value of device power dissipation for the various test segments is provided from the test system or customer database, based on prior parametric measurements. The thermal element power profiles are computed using the wafer map of active/inactive die or devices on the WUT and a map of WUT die or device locations versus TCW thermal element locations.

The following specific examples of the method of the second preferred embodiment are provided to illustrate the method, and should not be considered as being limiting on the scope of the invention.

The first example is a particularly simple case of uniform constant power dissipation ($P_0$) in the active WUT die or devices, zero power in the inactive WUT die or devices, $R_t=R_b=R$, and negligible lateral heat flows in the WUT and the TCW. The inactive WUT devices are compensated for by dissipating $2 \times P_0$ in the thermal elements immediately adjacent (i.e., below) the inactive devices, and dissipating no power in the thermal elements immediately below active WUT devices. This temperature profile provides a substantially uniform temperature profile across the WUT because, for an active device, the temperature standoff above the chuck temperature is $P_0 \times (R_t+R_b)=2P_0R$. For an inactive device in equilibrium, there is no heat flow from the WUT to the TCW in this case. Hence the WUT device temperature is the same as the thermal element temperature, which, by virtue of its power dissipation of $2P_0$ is just $(2P_0) \times R_b=2P_0R$ above the chuck temperature.

Figure 6:
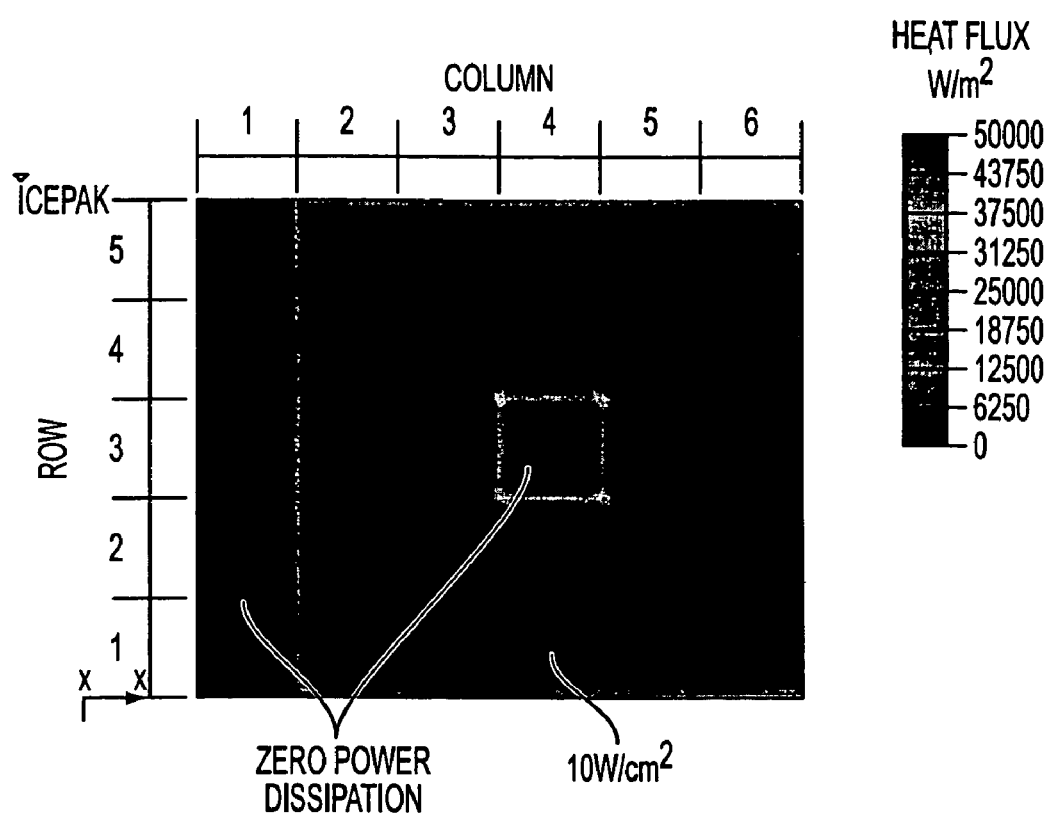
FIG. 6 is a graphic simulation of a wafer under test according to the second preferred embodiment of the present invention.

A second example is a finite element thermal simulation using the Icepak$^{tm}$ simulation program. The simulation was used to run equilibrium thermal simulations of a 5 row×6 column array of abutting WUT devices, all having 5 mm×5 mm (0.2 in×0.2 in) dimensions. In the simulation, the WUT devices are located on the top surface of the WUT and the thermal elements are located on the bottom surface of the TCW. The WUT rests on the TCW, which rests on an isothermal surface (representing the thermal chuck). Both the WUT and the TCW are modeled as 30 mil thick bulk silicon wafers with bulk thermal conductivity of 180 W/(m $^\circ$ C.). The contact resistances between WUT and TCW and between the TCW and the thermal chuck are assumed to be the same, at 1.0 ($^\circ$ C. cm$^2$)/W, uniformly distributed across the 30 mm×25 mm contact areas. All devices are active except for the left column (column 1) and the device centered in the remaining 5×5 array (row 3, column 4), as illustrated in FIG. 6. Active devices in the simulation dissipate 10 W/cm$^2$, with the power distributed uniformly within the device area. Thermal elements are modeled as having the same size (5 mm×5 mm) as the WUT devices, and lying directly beneath them. Any power dissipated by a thermal element is distributed uniformly within the thermal element's area.

Figure 7:
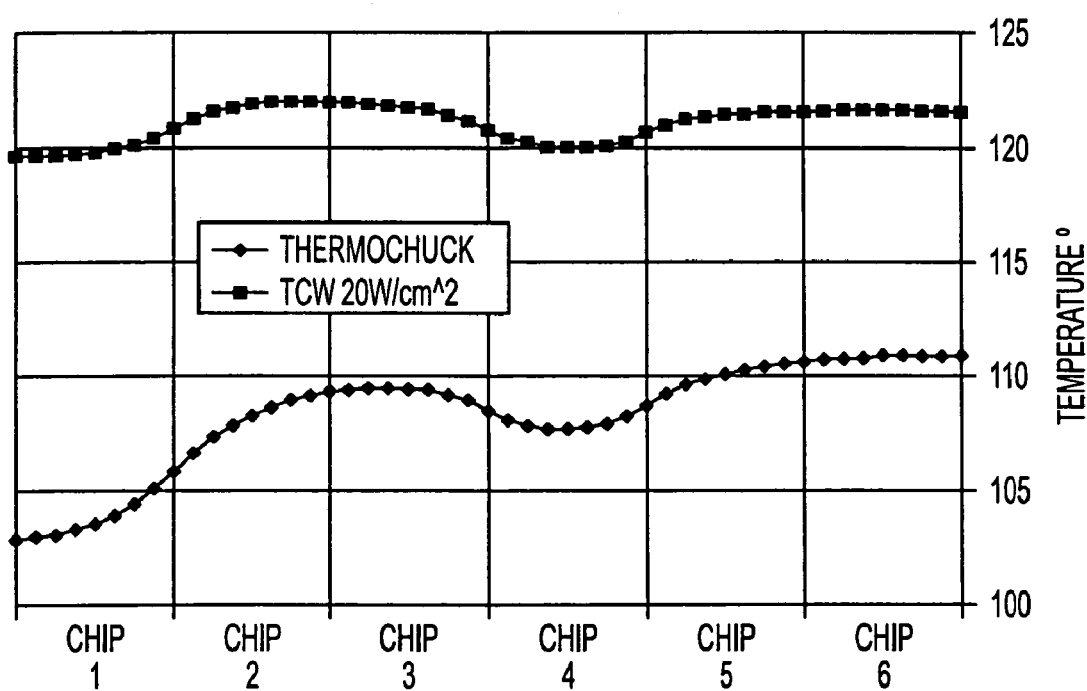
FIG. 7 is a plot of surface temperature versus location on the wafer under test shown in FIG. 6.

Two simulations were performed. The first simulation simulated an active TCW lying between the WUT and the isothermal thermal chuck (i.e., an example according to the second preferred embodiment). The second simulation simulated a WUT located directly on an isothermal thermal chuck (i.e., a comparative example). The thermal elements lying directly beneath the inactive WUT devices dissipate 20 W/cm$^2$. The thermal elements lying beneath active WUT devices are set to zero power dissipation. The thermal chuck is set at 100 degrees. Simulation results are shown in FIG. 7. Surface temperature of the WUT is plotted against the x coordinate for a horizontal line running through the center of the central inactive device in row 3, column 4. The lower line illustrates the comparative example, and the upper line illustrates the example with the TCW.

The regions of interest in FIG. 7 are those intervals corresponding to active devices, i.e., devices in row 3, columns 2, 3, 5 and 6. The active device or die bordering the inactive column (Column 2 in FIG. 6 and "Chip" 2 in FIG. 7) displays the largest temperature gradient and deviation from the mean. In the comparative example (lower line) there is a 3.5$^\circ$ C. drop across this device and temperature range of 5.1$^\circ$ C. across all active devices. Note that the temperature standoff is approximately half that of the TCW curves. This is to be expected, since the resistance to the thermal chuck is about half the TCW case.

In the active TCW simulation (upper line in FIG. 7), the worst-chip gradient is reduced to 1.2$^\circ$ C. (chip 3) and the temperature spread across all the active chips is 1.7$^\circ$ C. Thus, a more than 100% improvement in reducing the temperature gradients across the WUT was observed in the simulation. It should be noted that this result is achieved without 'tuning' the power dissipation of the thermal elements. Those under inactive devices were simulated as being on at full power at 20 W/cm$^2$, and those under active devices were completely off. Better results could be achieved by 'tapering' the thermal element power dissipation at the border regions.

Figure 11:
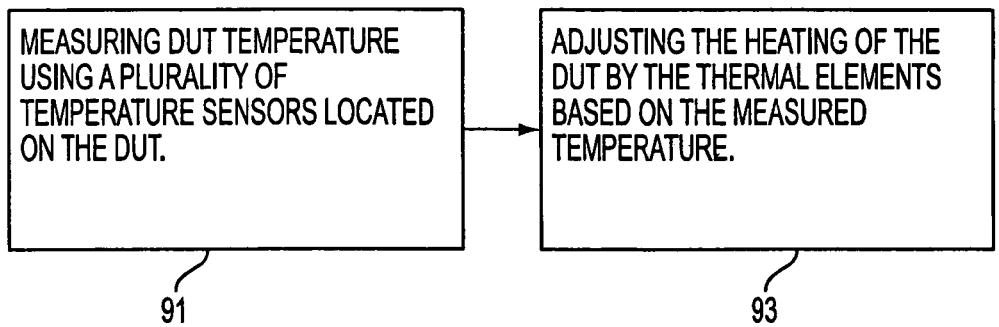

The Method Of The Third Embodiment. The thermal element control method according to the third preferred embodiment will now be described with respect to FIG. 11. This method uses direct feedback of WUT device temperature. In this embodiment, the temperature sensors are located directly on the WUT, preferably in each WUT die. In this embodiment, a physical mapping of WUT sensor to TCW thermal element is established. Then the thermal element heater powers are modulated to maintain a set point or target temperature based on measurements made by the WUT sensors (steps 91, 93).

The direct WUT temperature feedback temperature control method is more accurate than the methods of the first and second embodiments because it does not rely on thermal models and extracted parameters. Furthermore, the thermal elements may be simplified, such as thermal elements having a passive control circuit and no temperature sensors. Since the feedback originates from off the TCW, the WUT temperature values may be sent to the active control circuits in the thermal elements which adjust their heater power. Alternatively, the next set of thermal elements heater powers may be computed off the TCW and the downloaded to the thermal elements. However, the disadvantages of direct WUT temperature feedback method is that it requires dedicated real estate and electrical I/O on the WUT for the temperature sensors, and system response time is increased, especially for large numbers of thermal elements on the TCW.

Figure 12:
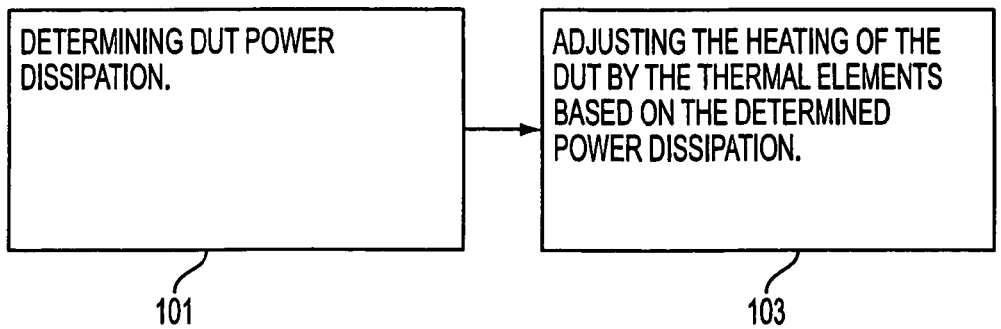

The Method Of The Fourth Embodiment. The thermal element control method according to the fourth preferred embodiment will now be described with respect to FIG. 12. This method uses direct feedback of WUT device power dissipation. In this method, the WUT power dissipation is determined (step 101) and the heating of the WUT by the thermal elements is adjusted based on the determined WUT power dissipation (step 103). This "power following" temperature control method for thermal control of single packaged devices undergoing test is disclosed in PCT Application PCT/US99/15846 filed on Jul. 14, 1999, which corresponds to U.S. application Ser. No. 09/352,760, filed Jul. 14, 1999, both incorporated herein by reference in their entirety.

In the single device power following mode described in these applications, an isothermal heater and thermometer are connected to the DUT through a thermal resistance $R_t$ and to a thermal reservoir through a thermal resistance $R_b$. The test system provides a signal to the control system that is proportional to the power $P_{DUT}$ dissipated in the DUT. The control system regulates the amount of power dissipated in the heater in order to maintain $T_{Heater}+R_t \times P_{DUT}$ at a setpoint.

This technique may be extended for wafer-level temperature control using the TCW. A WUT die or device power dissipation for each die or device in the WUT area of interest and an accurate positional mapping from WUT die or devices to the thermal elements is provided. The thermal control logic circuitry could be placed either on or off the TCW. If the logic circuits 11 are located in each thermal element, then the information about power dissipated by each WUT device is distributed among the appropriate thermal elements by a central controller. Preferably, the controller is located off the TCW and is embedded in software rather than hardware.

The controller reads from the TCW the temperatures of the thermal elements lying adjacent to a particular die or devices of the WUT. The controller further obtains the power of these WUT die or device from the test or burn-in system. The controller computes the required heater power and apportions it among the thermal elements. The controller then downloads the heater power data to the thermal elements.

One advantage of direct WUT power feedback method is that controlling $T_{Heater}+R_t \times P_{DUT}$ introduces a 'feedforward' aspect in the control algorithm, such that the heater power responds directly to a change in WUT die or device power. Thus, faster response times are possible because there is no need to wait for a change in the WUT die or device power to manifest itself in a change in $T_{Heater}$. Another advantage is that the thermal element structure may be simplified because active control logic circuits are not required for each thermal element.

The Method Of The Fifth Preferred Embodiment. The method of the fifth preferred embodiment is a simplification of the first embodiment. The physical setup is the same as for extrapolated temperature control of the first embodiment shown in FIG. 4, with the thermal control wafer or chip sandwiched between the WUT (or DUT) and a thermal reservoir, such as the thermal chuck. In this embodiment, all the active elements of the TCW (or the thermal control chip) are programmed to hold themselves at a constant temperature. From the point of reference of the WUT (or DUT), the TCW (or the thermal control chip) in this mode emulates a thermal chuck, but with the added ability to eliminate localized heating of the chuck surface by the WUT (or DUT). Compared with the first embodiment, the control circuitry can be simplified because there is no need to compute an extrapolated WUT temperature.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. It is intended that the scope of the invention be defined by the claims appended hereto, and their equivalents.

What is claimed is:

1. A solid state thermal control device, comprising:
a substrate; and
a plurality of substantially thermally isolated solid state thermal elements on the substrate adapted to provide thermal control to a device under test (DUT);
wherein each solid state thermal element comprises:
(a) at least one solid state heater; and
(b) a control logic circuit adapted to control a thermal output of the solid state heater.

2. The device of claim 1, wherein:
the substrate comprises a semiconductor wafer;
the thermal elements are arranged in or over the semiconductor wafer such that one or more thermal elements are adapted to provide thermal control to each die of a wafer under test; and
the control circuit comprises an active semiconductor logic control circuit.

3. The device of claim 2, wherein the heaters comprise integrated circuit resistors.

4. The device of claim 2, wherein the heaters comprise solid state thermoelectric or thermionic devices.

5. The device of claim 2, wherein the heaters comprise microelectromechanical heat pumps.

6. The device of claim 2, further comprising at least 1000 thermal elements on the substrate.

7. The device of claim 2, wherein a first active control circuit is adapted to actively control a magnitude of the thermal output of a first heater located in a same first thermal element as the first active control circuit.

8. The device of claim 7, wherein the plurality of thermal elements are adapted to provide different thermal outputs to maintain the DUT with a non-uniform spatial power dissipation during electrical testing or burn-in processing at a substantially uniform temperature during the electrical testing or burn-in processing.

9. The device of claim 7, wherein the thermal control device is adapted to provide thermal control for different types of DUTs undergoing electrical testing or burn-in processing independent of spatial or temporal variation in DUT power dissipation during the testing.

10. The device of claim 7, wherein the first active control circuit is adapted to actively control a magnitude of the thermal output of the first heater and of a second heater which are located in the first thermal element.

11. The device of claim 2, further comprising a solid state temperature sensor located in the plurality of thermal elements.

12. The device of claim 11, further comprising a plurality of thermal isolation regions which substantially thermally isolate adjacent thermal elements, wherein the isolation regions comprise at least one of air gap isolation trenches, trenches filled with low thermal conductivity material or semiconductor regions of lower thermal conductivity than the thermal elements.

13. The device of claim 11, wherein the plurality of thermal elements are adapted to be set to a single predetermined temperature.

14. The device of claim 1, wherein: the substrate comprises a portion of a semiconductor wafer, and the thermal elements are arranged in or over the portion of the semiconductor wafer such that two or more thermal elements are adapted to provide thermal control to a device under test which comprises a packaged semiconductor device, an unpackaged semiconductor die or a portion of a wafer under test.

15. The device of claim 11, wherein the active control circuits are adapted to continuously adjust the thermal output of the heaters based on temperature measured by the plurality of temperature sensors.

16. The device of claim 1, wherein the control circuits are adapted to adjust the thermal output of the heaters based on temperature measured by a plurality of second temperature sensors located on the DUT.

17. The device of claim 1, wherein the control circuits are adapted to adjust the thermal output of the heaters based on determined DUT power dissipation.

18. The device of claim 1, wherein the active control circuits are adapted to adjust the thermal output of the heaters based on a stored profile of DUT power dissipation.

19. A semiconductor wafer testing system, comprising:
(a) thermal control wafer, comprising:
    a semiconductor wafer substrate;
    a plurality of solid state thermal elements on the substrate adapted to provide thermal control to a wafer under test (WUT), wherein each thermal element comprises at least one solid state heater and a control logic circuit adapted to control a thermal output of the solid state heater;
(b) an electrical testing or burn-in processing probe located opposite a first side of the thermal control wafer, such that a wafer under test (WUT) location opening is created between the thermal control wafer and the probe; and
(c) a thermal reservoir located in thermal contact with a second side of the thermal control wafer.

20. The system of claim 19, wherein:
the thermal elements are arranged in or over the substrate such that one or more thermal elements are adapted to provide thermal control to one die of the WUT; and
the control logic circuits comprise active semiconductor logic control circuits located in or over the substrate.

21. The system of claim 20, wherein the heaters comprise at least one of integrated circuit resistors, solid state thermoelectric or thermionic devices and microelectromechanical heat pump devices.

22. The system of claim 21, further comprising at least 1000 thermal elements on the substrate.

23. The system of claim 20, wherein each active control circuit is adapted to independently control a magnitude of the thermal output of a heater in a same thermal element, such that the plurality of thermal elements provide a different amount of thermal output to maintain the WUT with a non-uniform spatial power dissipation during electrical testing or burn-in processing at a substantially uniform temperature during the electrical testing or burn-in processing.

24. The system of claim 23, wherein the system is adapted to provide thermal control for different types of WUTs undergoing electrical testing or burn-in processing independent of spatial or temporal variation in WUT power dissipation during the testing.

25. The system of claim 19, further comprising a plurality of solid state temperature sensors located in the plurality of thermal elements.

26. The system of claim 25, further comprising a plurality of thermal isolation regions which substantially thermally isolate adjacent thermal elements.

27. The system of claim 26, wherein a thermal resistance between adjacent thermal elements is at least two times larger than a thermal resistance between the thermal reservoir and a first thermal element, and at least two times larger than a thermal resistance between the first thermal element and a WUT located in the WUT location opening.

28. The system of claim 25, where the control circuits are adapted to actively adjust the thermal output of the heaters based on temperature measured by the temperature sensors.

29. The system of claim 28, wherein the control logic circuits are adapted to convert the measured temperature to a first signal whose frequency is a function of the measured temperature.

30. The system of claim 19, where the control logic circuits are adapted to adjust the thermal output of the heaters based on one of:
i) a temperature measured by a plurality of temperature sensors located on the WUT;
ii) a determined WUT power dissipation; or
iii) a stored profile of WUT power dissipation.

31. The system of claim 28, wherein the control logic circuits are adapted to extrapolate WUT die temperature from the first signal and to adjust the thermal output of the heaters based on comparing the extrapolated WUT die temperature to a set point temperature.

32. The system of claim 31, further comprising:
a housing in which the thermal reservoir which comprises a thermal chuck, the thermal control wafer and the testing probe are located; and
a central controller located remote from the thermal control wafer, which is adapted to control the control logic circuits located on the thermal control wafer.

33. A method of testing a DUT, comprising:
placing a first side of a DUT in thermal contact with a thermal control substrate containing a plurality of solid state thermal elements;
placing an electrical testing probe in contact with a second surface of the DUT;
performing electrical testing or burn-in processing of the DUT, wherein the DUT in an unheated state has at least one of a non-uniform spatial and temporal temperature or power dissipation during the testing; and
heating the DUT using the solid state thermal elements such that the DUT has a substantially uniform respective spatial, temporal or spatial and temporal temperature profile during testing.

34. The method of claim 33, wherein:
the thermal control substrate contacts a thermal reservoir;
the thermal control substrate comprises a semiconductor wafer containing at least 1000 thermal elements in or above its surface;
the thermal elements comprise at least one solid state heater and an control circuit;
the DUT comprises a semiconductor wafer under test (WUT);
at least one thermal element is located in thermal contact with a first region on the WUT; and
the at least one thermal element provides a substantially uniform spatial or temporal temperature profile for the first region.

35. The method of claim 33, wherein the thermal elements provide a substantially uniform spatial temperature profile across the WUT having a non-uniform spatial temperature or power dissipation during electrical testing or bum-in processing.

36. The method of claim 33, wherein the thermal elements provide a substantially uniform temporal temperature profile across an active area of the WUT having a non-uniform temporal temperature or power dissipation during electrical testing or bum-in processing.

37. The method of claim 33, wherein the thermal elements provide a substantially uniform spatial and temporal temperature profile across an active area of the WUT having a non-uniform spatial and temporal temperature or power dissipation during electrical testing or bum-in processing.

38. The method of claim 34, further comprising:
individually measuring a temperature of thermal elements using temperature sensors located in the thermal elements;
providing measured temperature data to active logic circuits located in the thermal elements;
extrapolating individual WUT region temperature from the measured temperature of the thermal elements;
determining if the extrapolated temperature of at least one WUT region deviates from a set point temperature by more than a first amount; and
independently controlling the magnitude of the thermal output of the plurality of the solid state heaters located in the thermal elements.

39. The method of claim 38, wherein the measured temperature is continuously provided to a plurality of logic circuits located on the thermal control substrate, which continuously individually control the magnitude of the thermal output of one or more heaters located in a same thermal element as a given logic circuit.

40. The method of claim 39, wherein the measured temperature is converted to a first signal whose frequency is a function of the measured temperature.

41. The method of claim 33, wherein:
the thermal control substrate comprises a portion of a semiconductor wafer;
the DUT comprises a portion of a semiconductor wafer under test, a packaged semiconductor device or an unpackaged semiconductor die; and
at least two thermal elements are located in thermal contact with the DUT and provide a substantially uniform spatial or temporal profile for the DUT.

42. The method of claim 33, further comprising changing a set point temperature of the thermal elements without handling, disturbing, or recontacting the DUT.

43. The method of claim 33, further comprising measuring DUT temperature using a plurality of temperature sensors located on the DUT and adjusting the heating of the DUT by the thermal elements based on the measured temperature.

44. The method of claim 33, further comprising determining DUT power dissipation and adjusting the heating of the DUT by the thermal elements based on the determined power dissipation.

45. The method of claim 33, further comprising storing a DUT power dissipation profile and adjusting the heating of the DUT by the thermal elements based on the stored power dissipation profile.

46. The method of claim 34, wherein:
the thermal reservoir comprises a thermal chuck;
the electrical testing probe comprises a wafer with pads which contact microspring contactors located on the WUT; and
performing electrical testing or bum-in processing comprises simultaneously performing electrical testing or bum-in processing of a plurality of die of the WUT.

* * * * *